United States Patent
Tsironis (10) Patent No.: US 10,725,092 B1
(45) Date of Patent: Jul. 28, 2020

(54) PRE-MATCHED COAXIAL TRANSISTOR TEST FIXTURE

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 254 days.

(21) Appl. No.: 15/847,139

(22) Filed: Dec. 19, 2017

Related U.S. Application Data (60) Provisional application No. 62/436,126, filed on Dec. 19, 2016.

(51) Int. Cl.
*G01R 31/28* (2006.01)

(52) U.S. Cl.
CPC .............................. *G01R 31/2822* (2013.01)

(58) Field of Classification Search
CPC .... G01R 31/2822; G01R 27/28; G01R 27/32; G01R 35/005; G01R 31/2601; G01R 31/2612; G01R 31/2837; G01R 35/00; G01R 1/07; G01R 27/04; G01R 31/2614; G01R 31/2839; H03H 7/40; H03H 7/38; H03H 11/28

See application file for complete search history.

(56) References Cited

U.S. PATENT DOCUMENTS

| | | | | |
|---|---|---|---|---|
| 3,417,350 | A * | 12/1968 | Cruz | H03J 1/08 333/35 |
| 3,943,463 | A * | 3/1976 | Kuno | H03B 9/145 331/107 DP |
| 6,414,563 | B1 | 7/2002 | Tsironis | |
| 2003/0122633 | A1* | 7/2003 | Tsironis | H01P 5/04 333/17.3 |

FOREIGN PATENT DOCUMENTS

| | | | | |
|---|---|---|---|---|
| GB | 827021 | A * | 1/1960 | H01P 5/04 |

OTHER PUBLICATIONS

Ghannouchi, Load-Pull Techniques with Applications to Power Amplifier Design, Chapter 5, pp. 124-130, Springer, 2013 (Year: 2013).*
Milovanovic et al., Calculation of Characteristic Impedance of Eccentric Rectangular Coaxial Lines, Przeglad Elektrotechniczny 88(10a):260-264, 2012 (Year: 2012).*
"Test Fixture for Medium and High Power RF Transistors", Product Note 7, Focus Microwaves, Jan. 1994.
"Load Pull", [online], Wikipedia [Retrieved on Nov. 18, 2016] Retrieved from Internet <URL: http://en.wikipedia.org/wiki/Load_pull>.
"GaN RF Power Transistor" QPD2795 Data sheet, [online], Triquint/Qorvo, [Retrieved on Dec. 7, 2016] Retrieved from Internet ,URL: http://www.qorvo.com/products/p/QPD2795>.

(Continued)

*Primary Examiner* — Daniel R Miller (57) ABSTRACT

Coaxial microwave transistor test fixtures provide lowest insertion loss possible and include, as part of the input and output sections, transformer networks either in form of single stage λ/4 segments, or, for larger bandwidth, multiple step segments or ramped transitions from 50Ω to the impedance closer to the internal impedance of the power transistor. The transforming networks are flat or cylindrical and can be made exchangeable in order to accommodate various transforming ratios using the same fixture body and coaxial adapters. The fixtures can be calibrated using standard TRL method.

9 Claims, 15 Drawing Sheets

(56) References Cited

OTHER PUBLICATIONS

"Lecture 22: Measurement Errors. TRL Calibration of a VNA", K.W. Whites, EE 481/581, course syllabus, South Dakota School of Mines and Technology.
"Tapered lines, notes", Jim Stiles, University of Kansas, Dept. of EECS, Apr. 26, 2010.
"EEsof EDA Advanced System Designs" Brochure 5988-3326EN, Keysight Technologies, Dec. 30, 2014.
"WR-284 Standard Gain Horn Antenna Operates", PE9863-NF10 Datasheet, [online], Pasternack [Retrieved on Dec. 7, 2016] Retrieved from Internet <URL:https://www.pasternack.com/standard-gain-horn-waveguide-size-wr284-10-db-gain-n-female-pe9863nf-10-p.aspx>.

* cited by examiner

FIG. 15B    View A

PRE-MATCHED COAXIAL TRANSISTOR TEST FIXTURE

PRIORITY CLAIM

This application claims priority on provisional application 62/436,126, titled: Pre-Matched Coaxial Transistor Test Fixture, filed on Dec. 19, 2016.

CROSS-REFERENCE TO RELATED ARTICLES

1. TSIRONIS, U.S. Pat. No. 6,414,563, "Low-Loss Microwave Device Test Fixture with Adjustable Blocks"
2. "Test Fixture for Medium and High Power RF Transistors", Product Note 7, Focus Microwaves, January 1994
3. "Load Pull", [online], Wikipedia [Retrieved on Nov. 18, 2016] Retrieved from Internet <URL: http://en.wikipedia.org/wiki/Load_pull>.
4. "GaN RF Power Transistor" QPD2795 Data sheet, [online], Triquint/Qorvo, [Retrieved on Dec. 7, 2016] Retrieved from Internet <URL: http://www.qorvo.com/products/p/QPD2795>.
5. "Lecture 22: Measurement Errors. TRL Calibration of a VNA", K. W. Whites, EE 481/581, course syllabus, South Dakota School of Mines and Technology.
6. "Tapered lines, notes", Jim Stiles, University of Kansas, Dept. of EECS, Apr. 26, 2010.
7. "EEs of EDA Advanced System Designs" Brochure 5988-3326EN, Keysight Technologies, Dec. 30, 2014.
8. "WR-284 Standard Gain Horn Antenna Operates", PE9863-NF10 Datasheet, [online], Pasternack [Retrieved on Dec. 7, 2016] Retrieved from Internet <URL:https://www.pasternack.com/standard-gain-horn-waveguide-size-wr284-10-db-gain-n-female-pe9863nf-10-p.aspx>.

BACKGROUND OF THE INVENTION

Figure 1:
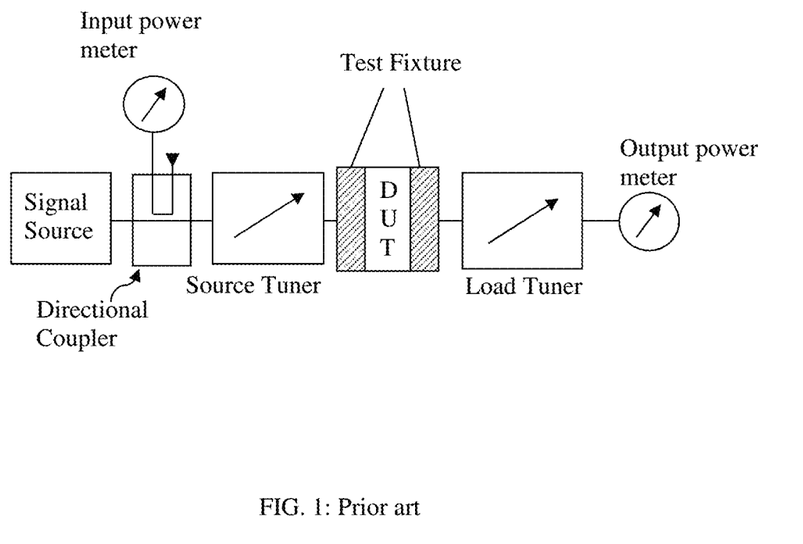
FIG. 1 depicts prior art, a traditional load pull measurement setup.
Figure 2A:
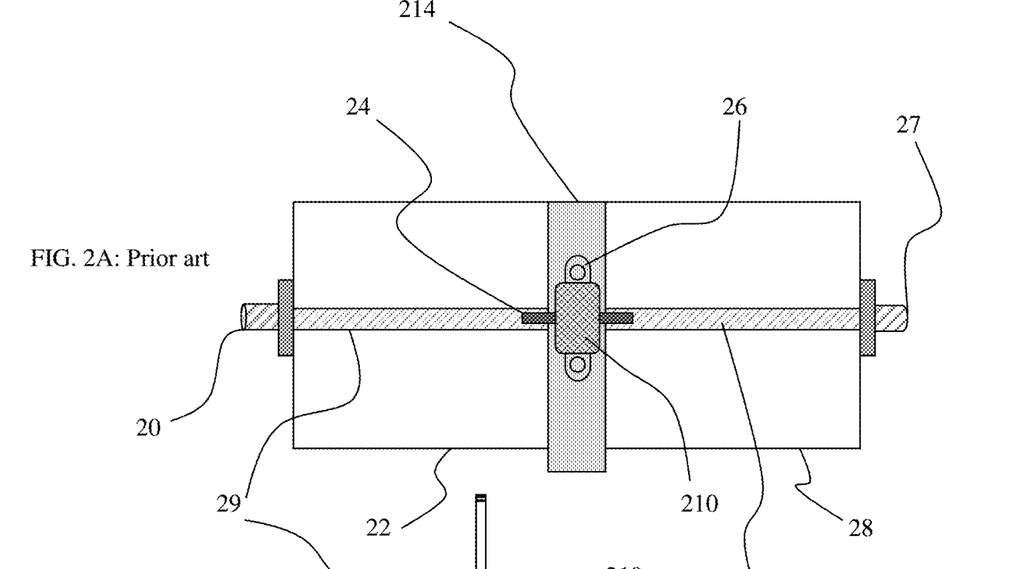
FIG. 2A depicts top view of a micro-strip transistor test fixture.
Figure 2B:
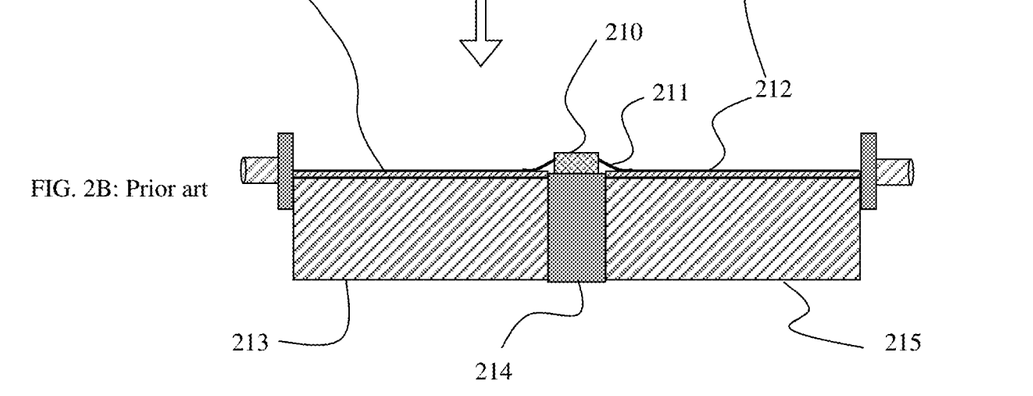
FIG. 2B depicts side view of the micro-strip transistor test fixture.

This invention relates to test fixtures used in testing RF transistors in microwave frequencies (see ref. 1, 2). Active RF components (transistors—DUT) need to be thoroughly tested at the operation frequencies before used in amplifier and other circuit designs. "Load pull" and "Source pull" (see ref. 3) are test methods which use impedance tuners to systematically characterize the DUTs under various load and source impedance conditions. Load pull or source pull are automated measurement techniques used to measure Gain, Power, Efficiency and other characteristics of the DUT, employing, beyond source and load impedance tuners, also other test equipment, such as signal sources, directional couplers, test fixtures to house the DUT and input and output power meters (FIG. 1), see ref. 3. Typical test fixtures (see ref. 2) used are based on micro-strip structure (FIG. 2). Signal power from the signal source is measured by the input power meter and injected into the DUT through the source tuner. The power generated by the DUT is measured by the output power meter after traversing the output tuner. The tuners generate the source and load impedances required for the testing. Prior component calibration (test fixture, tuners, couplers etc.) allows de-embedding measured data from the power meters to the DUT reference plane.

Figure 3:
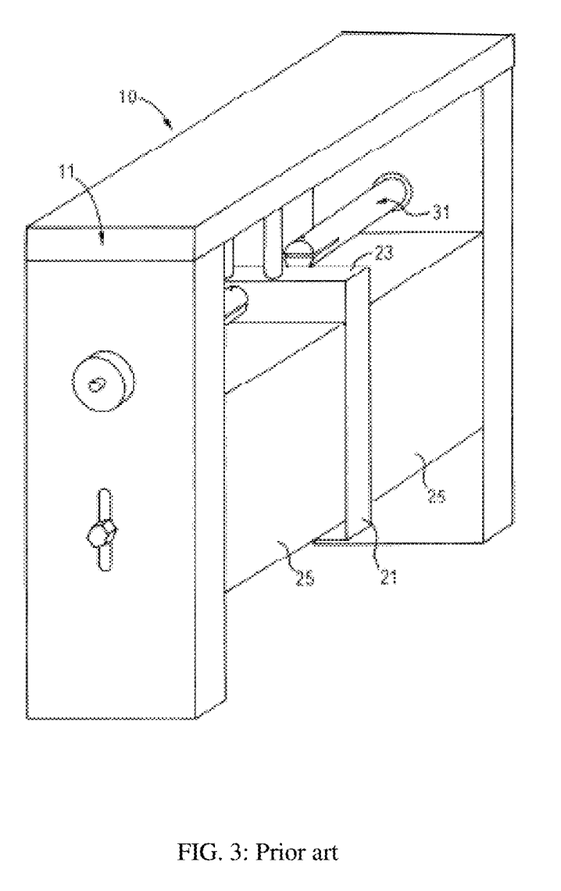
FIG. 3 depicts prior art, a 3D view of coaxial 50Ω test fixture.

Test fixtures (FIG. 2 or 3) include grounded input (22, 213) and output (28, 215) body sections, a cover ((10) in FIG. 3) and a DUT INSERT (21, 23, 214). The DUT (210) is mounted on the INSERT (214) using screws (26) or other securing mechanism. The fixture has input (20) and output (27) connectors and microstrip lines (29, 212) between the connectors. The microstrip lines comprise a dielectric layer on which a thin copper conductor layer (29, 212) remains after etching using acids and photolithographic process. The DUT (210) package has leads (51, 52, 24, 211) which can be soldered or secured on the microstrip (29, 212), see FIG. 5 and ref. 4.

BRIEF DESCRIPTION OF THE INVENTION

Figure 5:
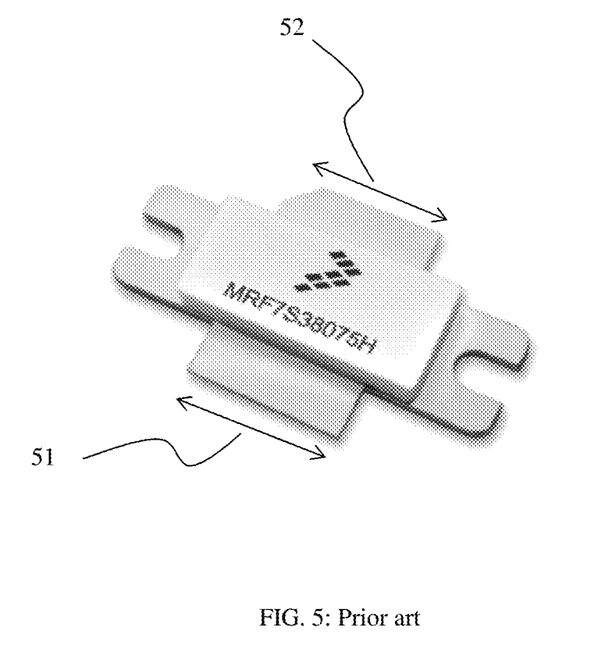
FIG. 5 depicts prior art, a packaged RF power transistor.

High power transistors have very low input and output internal impedance, of the order of 1 to 3n. For accurate load pull testing, the tuners must physically match these impedances, i.e. they must generate conjugate complex impedances as those of the DUT. In terms of reflection factor, the tuners must generate reflection factors of up to 0.95 and phase opposite of the phase of the DUT internal reflection factor. However the inherent tuning range of the tuners is reduced by the insertion loss of the test fixture; therefore there is requirement for extremely low loss test fixtures. Most existing microstrip fixtures (FIG. 2) have non-negligible insertion loss due to the used dielectric material on which the microstrip lines (29, 212) are etched photolithographically. Since air has the lowest insertion loss of any transmission media, it is logical to make and use airlines in a coaxial test fixture structure, instead of micro-strip, as long as it is technically feasible. In 2000/2002 such a fixture was disclosed (see ref. 1). However this fixture has 50Ω transmission airlines (31, 47, 48) which are not the optimum solution for matching low impedance targets (DUT), both from RF reflection and from mechanical points of view; as shown in FIG. 5 the transistor leads (51, 52) are wide and, for best power transfer, should also be mechanically matched to the adjoining center conductors of the test fixture.

This invention discloses a new embodiment of a coaxial fixture, whereby the transmission airline has characteristic impedance Z1 different from 50Ω; in fact by widening the center conductor (48) one can reach lower Z1 or, by narrowing it, one can reach higher Z1, in order to match the internal impedance of the DUT. In the present embodiment we concentrate on lowering Z1, but increasing it is possible, as well. The general rule applies that, when a $\lambda/4$ long transforming section of transmission line with a characteristic impedance Z1 is attached to a transmission line with a characteristic impedance Zo (typically 50Ω), which is terminated with Zo, then on the other side of the transmission line with characteristic impedance Z1 one sees $Z2=Z1^2/Zo$. As an example: if Z2 shall be equal to 10Ω (Z2=10Ω), then the transforming section must have a characteristic impedance of Z1=22.36Ω.

BRIEF DESCRIPTION OF THE DRAWINGS

The invention and its mode of operation will be better understood from the following detailed description when read with the appended drawings in which:

FIGS. 2A through 2B depict prior art.

FIGS. 4A through 4B depict prior art.

FIGS. 6A through 6B depict a pre-matched coaxial test fixture using λ/4 (quarter lambda) impedance transforming sections.

FIGS. 7A through 7B depict a pre-matched coaxial test fixture using wideband transformer sections.

FIGS. 8A through 8B depict 3D views of mounting the packaged transistor of FIG. 5 in the fixture of FIG. 7; FIG. 8A depicts the packaged transistor (DUT) and FIG. 8B depicts the DUT mounted into the transforming section of the center conductor of the fixture.

FIGS. 15A through 15B depict elliptical transforming segments.

DETAILED DESCRIPTION OF THE INVENTION

Figures 4A, 4B:
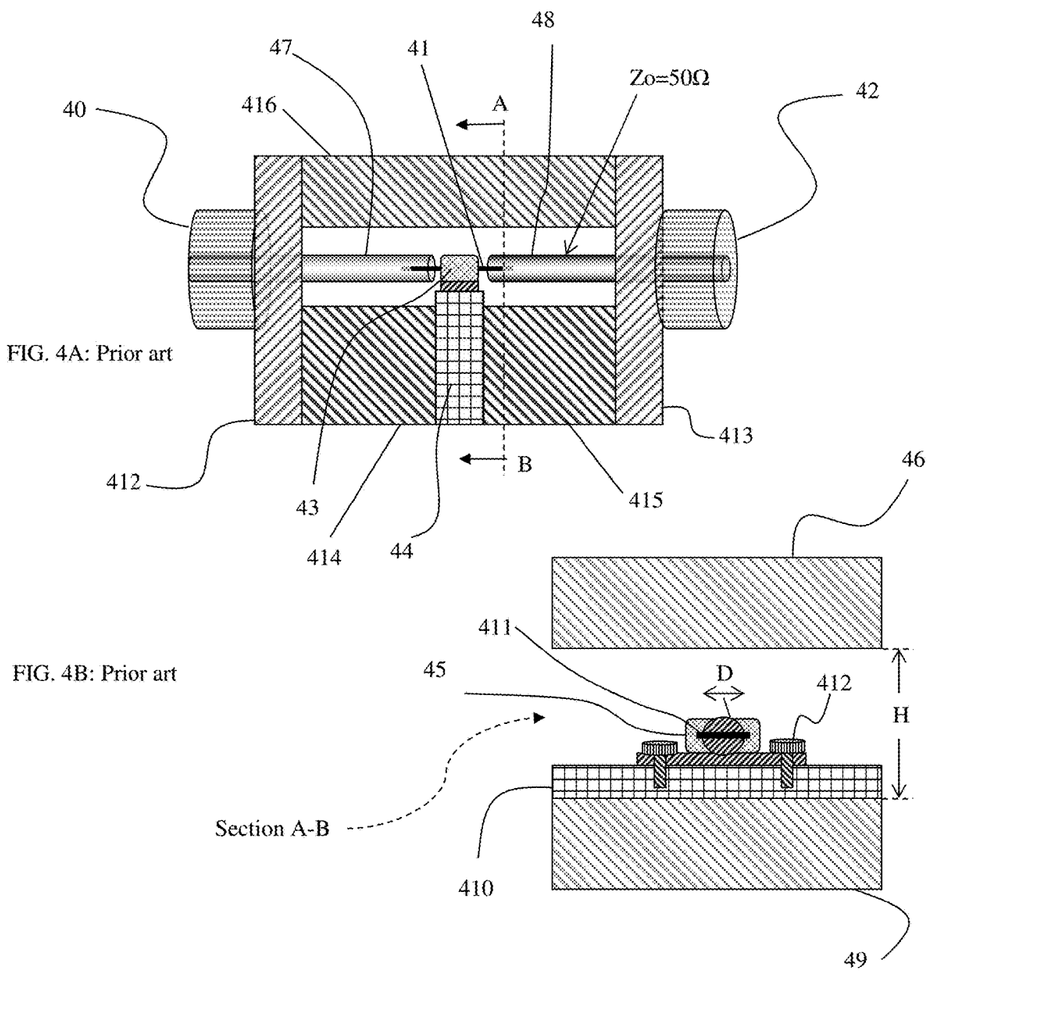
FIG. 4A depicts side view of 50Ω coaxial test fixture.
FIG. 4B depicts front view of cross section "A-B" of 50Ω coaxial test fixture.

FIGS. 3 and 4 show the prior art coaxial transistor test fixture (see ref. 1). Two coaxial connectors (40, 42) are attached to vertical walls (412, 413) and the extensions of the center conductors (31, 47, 48) form with the two blocks (25, 414, 415) and the cover (11, 416) an open transmission line (slabline), which is interrupted in the center to INSERT a block (21, 44), referred hitherto as "insert", which carries the packaged DUT (43). In this case the transistor package (43) is placed on the INSERT (44) which is part of the horizontal slabline structure formed of the bottom ground planes (49, 412, 413) and the top ground planes (46, 416) in FIGS. 4A and 4B and the center conductor (47, 48). The signal enters in the input port (40), leaves at the output port (42) and is being conducted to and from the transistor DUT by the two coaxial center conductor segments (47, 48). The transistor leads (41) are inserted into horizontal slots (411) of the center conductor segments facing the DUT. The test fixture INSERT (44, 410) holds the transistor package (43, 45) secured with two screws (412) to ensure good RF grounding and heat dissipation. The advantage of this type of test fixture is lower insertion loss between the transistor leads (41) and the input (40) and output (42) ports and by consequence it allows higher tuning range created by the tuners.

Figure 6A:
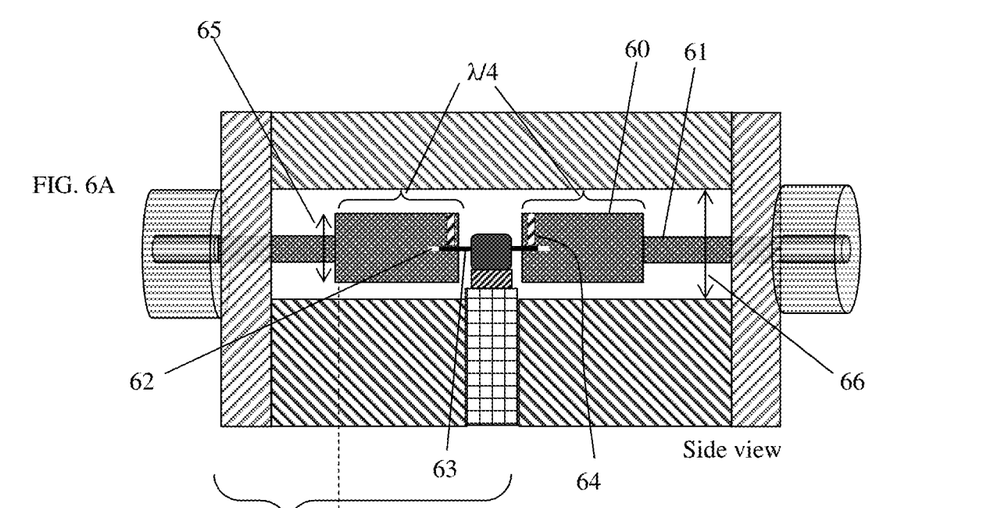
FIG. 6A depicts a side view.
Figure 6B:
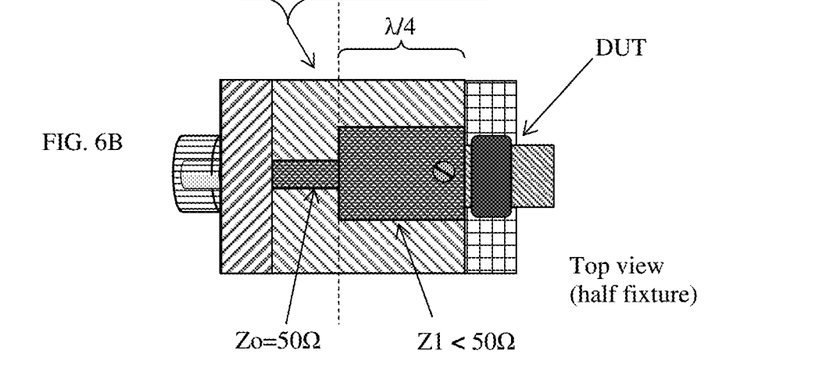
FIG. 6B depicts a top view of the left section of the fixture in FIG. 6A with the cover removed.

In a first embodiment of a pre-matching coaxial test fixture the impedance transformers are quarter wavelength (λ/4) sections of center conductor creating characteristic impedance Z1 lower than 50Ω in the slabline. These sections can be cylindrical or parallelepiped, for which electromagnetic simulation and analysis determines the correct dimensions. Typically, in a slabline structure with a wall-to-wall gap of 20 mm, a cylindrical center conductor of 11 mm diameter creates Zo=50.3Ω and a center conductor of 17 mm diameter creates a characteristic impedance of 24.2Ω. A rectangular center conductor of 17 mm width and 5 mm thickness creates a Zo of 50.6Ω and a 13 mm×7 mm center conductor creates a Zo of 21Ω in the same slabline. It is therefore possible to adjust the characteristic impedance of the transforming sections to electrically match the DUT impedance and to mechanically match the width of the package leads (51, 52) as well. FIG. 6 shows a side (FIG. 6A) and top (FIG. 6B) view of a pre-matching coaxial test fixture using parallelepiped transforming sections. The transforming sections are λ/4 long.

Further on in FIG. 6A, beyond the λ/4 transforming sections (60) attached to the 50Ω sections of center conductor (61), one recognizes the DUT leads (63) inserted into the transformer section slots (62) and secured by the vertical screws (64). FIG. 6B shows the top view of the left half part of the fixture without the cover. It shall be noticed that the two halves of the fixture do not have to be identical. Existing calibration techniques allow characterizing accurately non-symmetrical test fixtures as well (see ref. 5).

Figure 7A:
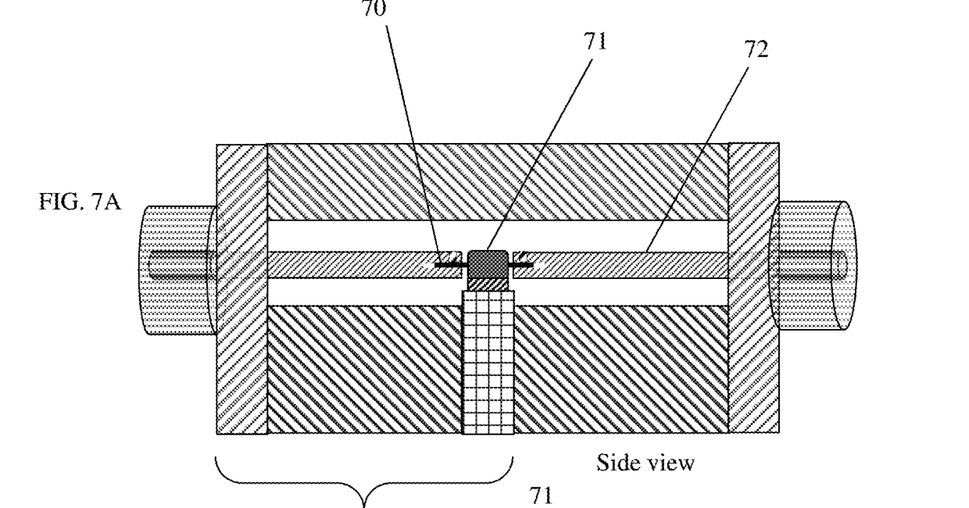
FIG. 7A depicts a side view.
Figure 7B:
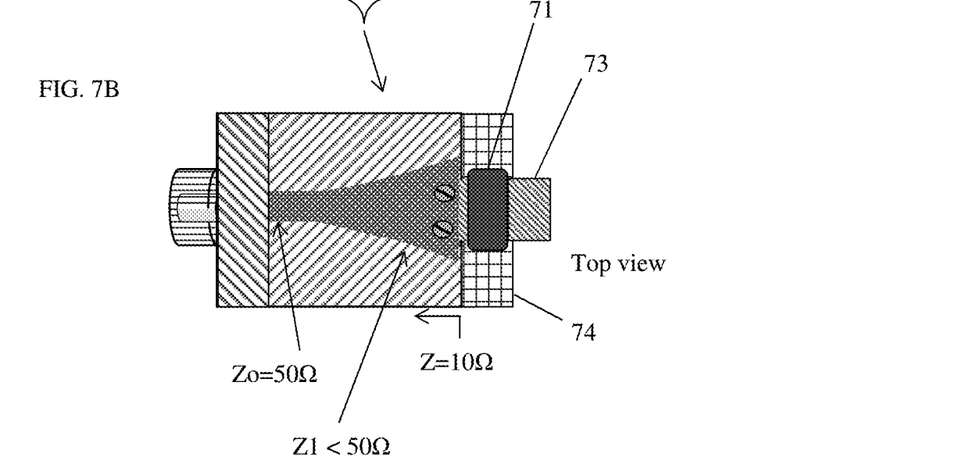
FIG. 7B depicts a top view of the left section of the fixture in FIG. 7A with the cover removed.
Figure 12:
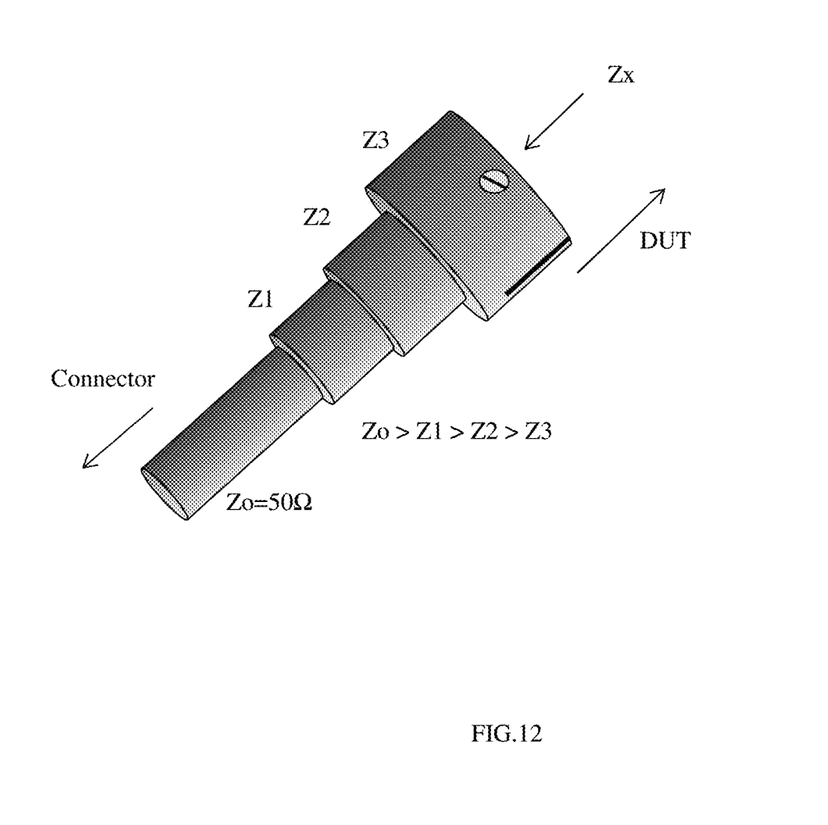
FIG. 12 depicts a 3D view of wideband transforming structure of input or output section of center conductor of coaxial test fixture.

Using single stage λ/4 transformers is narrowband (see FIG. 13); it works best at the specific frequency F in gigahertz, F(GHz)=75/L(mm), whereby L is the length of the transforming section in millimeters. In order to increase the effective bandwidth one has two choices: (i) in a first embodiment use multiple transforming steps with decreasing characteristic impedance Z1>Z2>Z3 . . . from the 50Ω center conductor to the DUT terminals (FIGS. 12 and 14) or (ii) in a second embodiment use "ramped" transformers (see ref 6, FIGS. 7 and 8), whereby the center conductor becomes larger (the characteristic impedance becomes smaller) as we get closer to the DUT. In both cases the transforming sections become substantially longer, and the determination of their exact dimensions require specific network calculation software (see ref. 7).

Figure 8A:
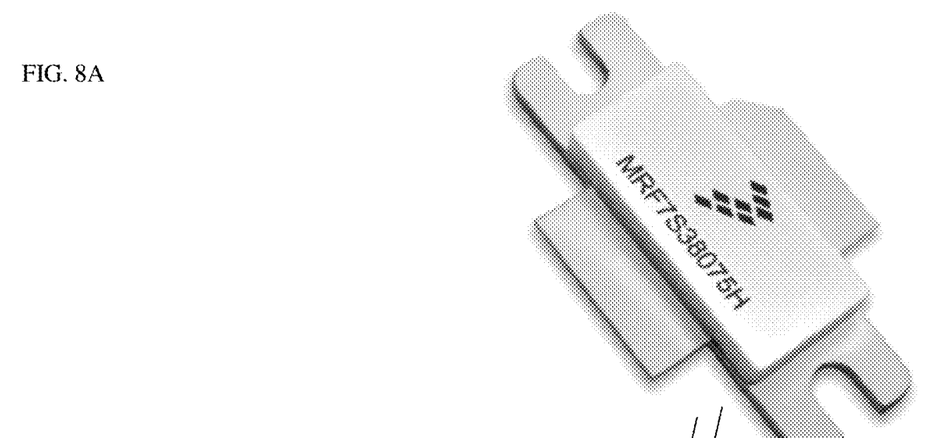
Figure 8B:
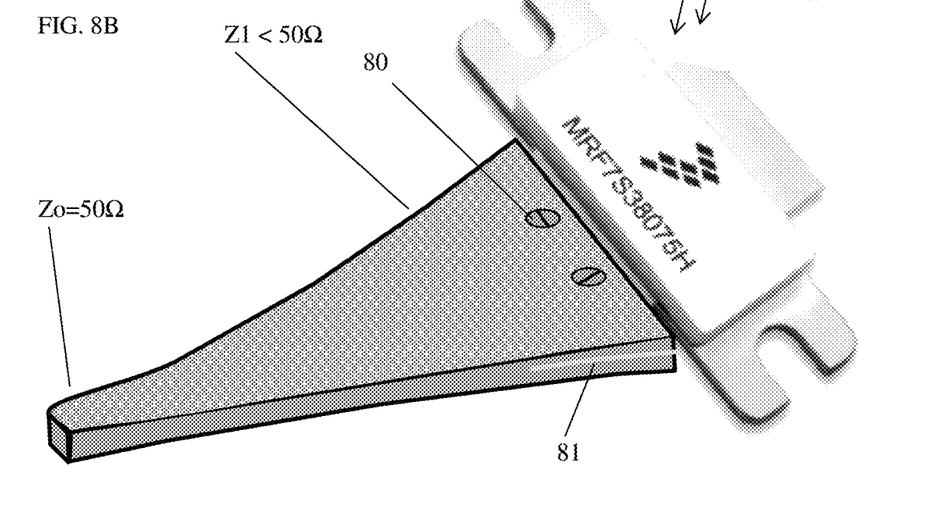
Figure 13:
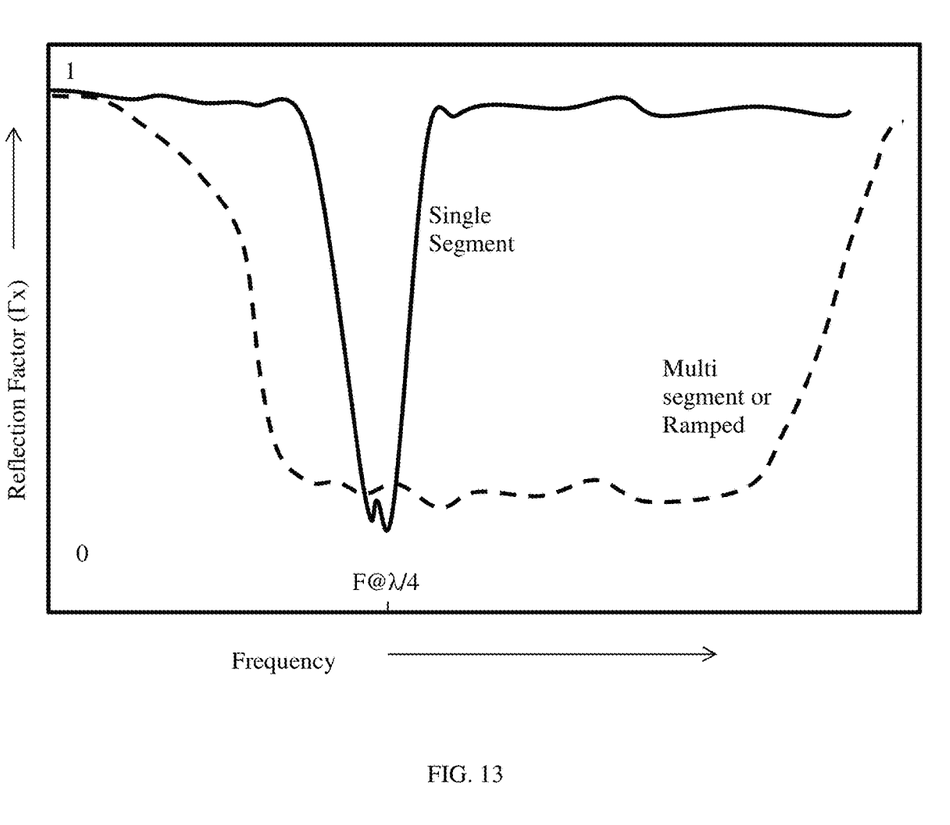
FIG. 13 depicts the frequency response of the reflection factor of the input and output sections of the test fixture when terminated with the low internal impedance of the DUT; multi step transformer covers a higher frequency band.
Figure 14:
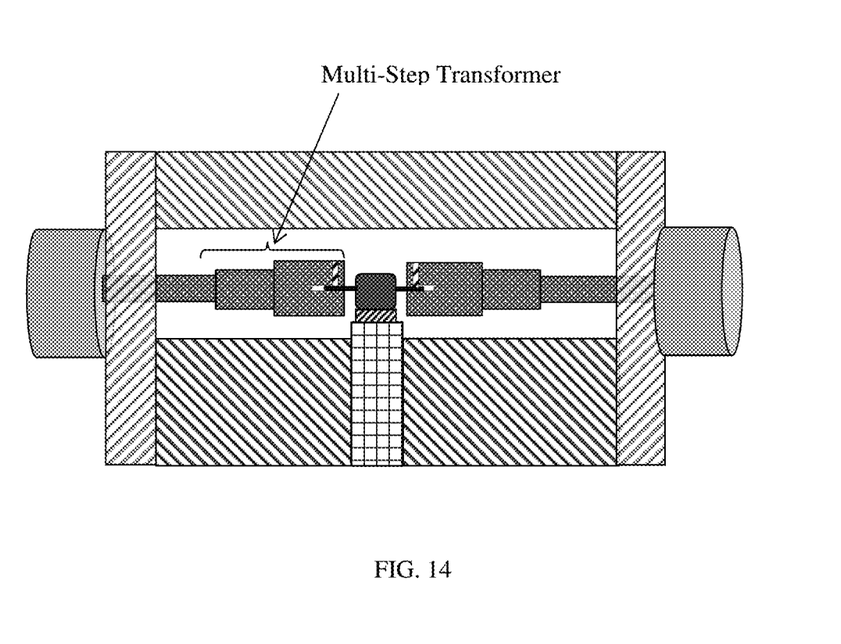
FIG. 14 depicts a front view of the multi-step transforming coaxial test fixture.

In the second embodiment (FIG. 7A) the leads (70, 73) of the DUT (71) are inserted and secured into slots of the transmission transformer (72) and the body (71) of the package is secured on the INSERT (74); the transforming center conductor is ramped (FIG. 7B) and is dimensioned to present to the DUT an impedance of 10Ω over a wide frequency band (FIG. 13). To achieve this the transforming section increases in width (and/or also in thickness) gradually and the characteristic impedance Z1 decreases gradually from 50Ω (see FIG. 8B). In particular the width of the transforming section can be designed to match the width of the package leads (51, 52). FIG. 8 shows the packaged DUT (FIG. 8A) before and after (FIG. 8B) insertion into the slot (81) of the transforming center conductor, on which it is secured using one or more vertical screws (80). This choice of transformer is particularly easy to manufacture, because it only takes a piece of sheet metal properly contoured. If the width of the transformer at the DUT end must match the leads of the DUT (51, 52) and create a given lower characteristic impedance, the transformer can also be made thicker close to the DUT (thicker transformer allows narrower width for the same characteristic impedance). In this case the transformer will have a pyramidal form and looks more like a horn antenna (see ref. 8).

Figure 9:
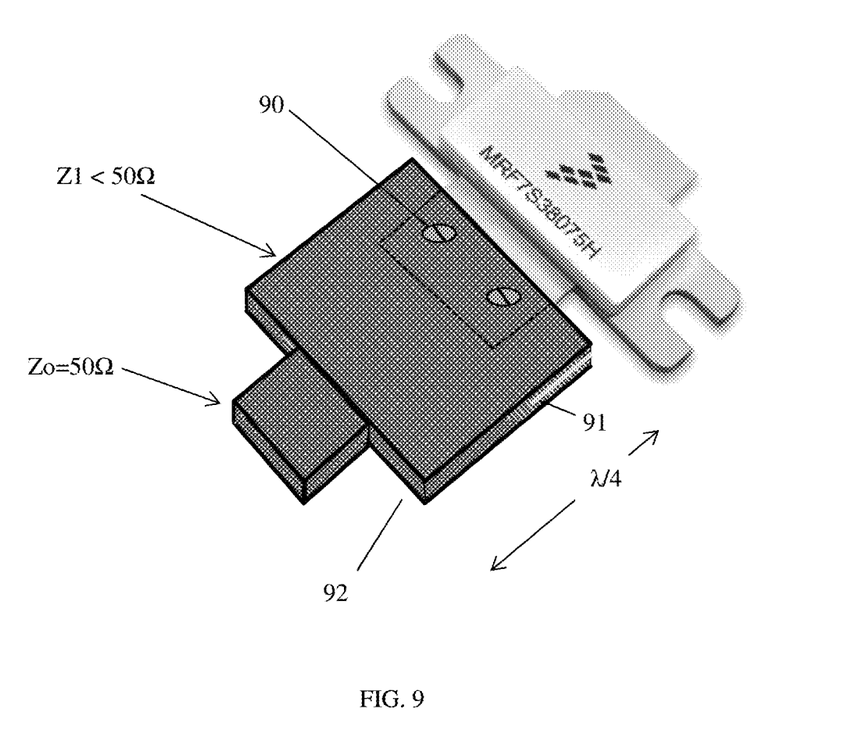
FIG. 9 depicts a 3D view of the packaged transistor of FIG. 5 being mounted into the transforming section of the center conductor of the fixture of FIG. 6.

The 3D view of the single stage λ/4 flat transformer is shown in FIG. 9. One can distinguish the holding screws (90) that secure the DUT lead which is inserted into the slot (91) of the transforming section (92). It is desirable but not necessary to select the width of the transforming section (92) to match the width of the DUT leads (51, 52). If mostly the same package of DUT is used, then the choice of thickness (65) of the transforming section (92) can be chosen to account for this. As an example: in a slabline with a top to bottom channel width of 20 mm a λ/4 transforming section 20 mm wide and 10 mm thick creates a characteristic impedance Z1 of 30.5Ω. The same Z1 can be obtained if the same section is, instead, 25 mm wide and 8.25 mm thick, or 15 mm wide and 11.75 mm thick. In all cases the impedance seen by the DUT, when the fixture is terminated with 50Ω is $Z2=Z1^2/50\Omega \approx 18.6\Omega$.

Figure 10:
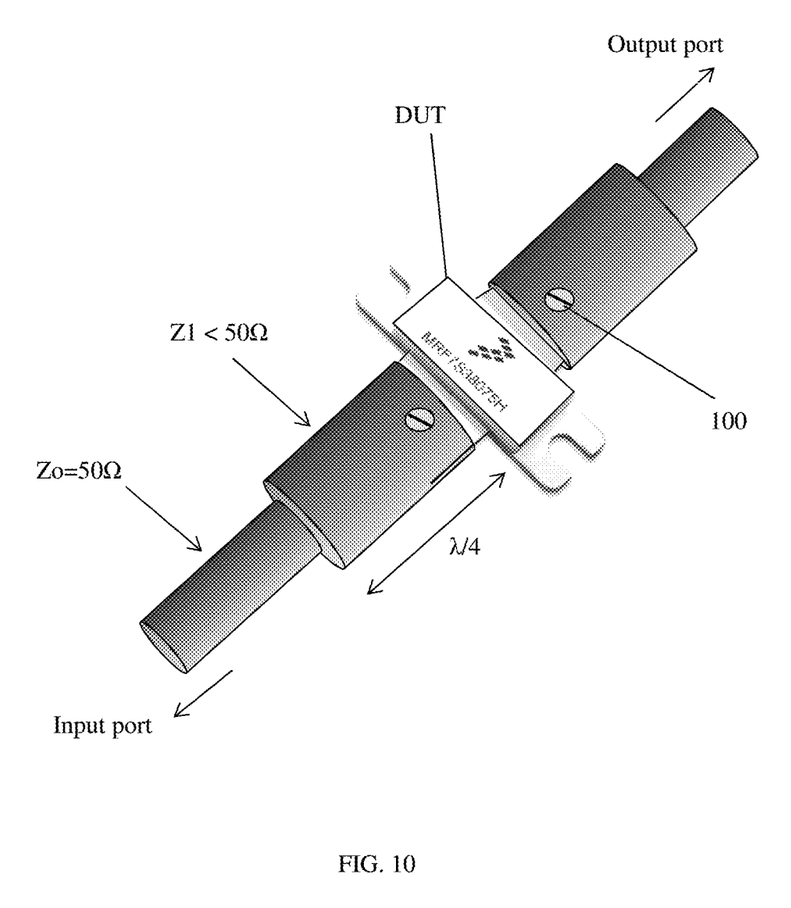
FIG. 10 depicts a 3D view of the packaged transistor being mounted in the cylindrical transforming center conductor sections of the test fixture.

FIG. 10 shows single stage λ/4 cylindrical transformers, forming the core of the coaxial test fixture, attached to both leads of the DUT. The leads of the DUT are inserted into slots cut parallel to the axis of the transformers and secured with screws (100).

Figure 11:
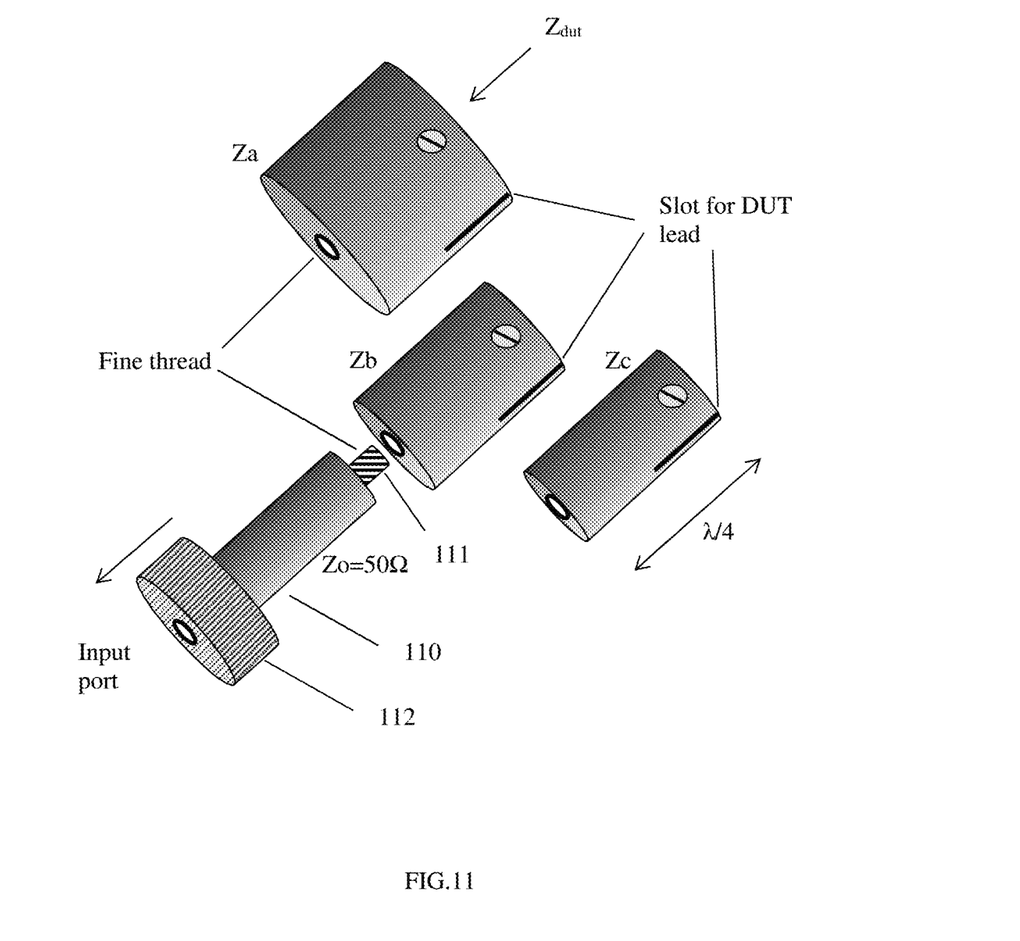
FIG. 11 depicts a 3D view of exchangeable λ/4 transmission segments of center conductor of coaxial test fixture with characteristic impedances Za<Zb<Zc.

FIG. 11 shows a useful variant of the coaxial fixture, in which a number of λ/4 transformers, each having a different characteristic impedance (Za<Zb<Zc . . . ) can be used and exchanged, easily mounted and dismounted on the extension of the center conductor (110) using a centered screw with a fine thread (111). The body of the fixture remains the same and uses the same adapters (112) and coaxial lines (110). The impedance $Z_{dut}$ seen by the DUT follows the above outlined rule: $Z_{dut}=Zt^2/Zo$, whereby Zo=50 Ω and Zt is the characteristic impedance of the transformer (Zt=Za, Zb, Zc . . . ), as an example, if Zt=20Ω, the DUT will "see" an impedance of 400/50=8 Ω when the test fixture is terminated with 50Ω on the other end. Starting tuning from this point will easily create impedances of 1 or 2Ω.

In a third embodiment (FIG. 12) the 3D view of the multi-section wideband cylindrical transformer in step-form is shown, which also allows larger instantaneous bandwidth (FIG. 13). This is also shown in the front view of FIG. 14. It is obvious that this technique also applies to the flat transformers of FIGS. 6 and 9. In FIG. 13 the Reflection Factor (Fx) is related to the target impedance Zx, to be presented to the DUT. If this impedance is Zx then Fx is defined as: Fx=(Z−Zx)/(Z+Zx), whereby Z is the actual impedance presented by the transforming fixture to the DUT (i.e. if the generated impedance Z is equal to the target Zx then Fx=0).

Figure 15A:
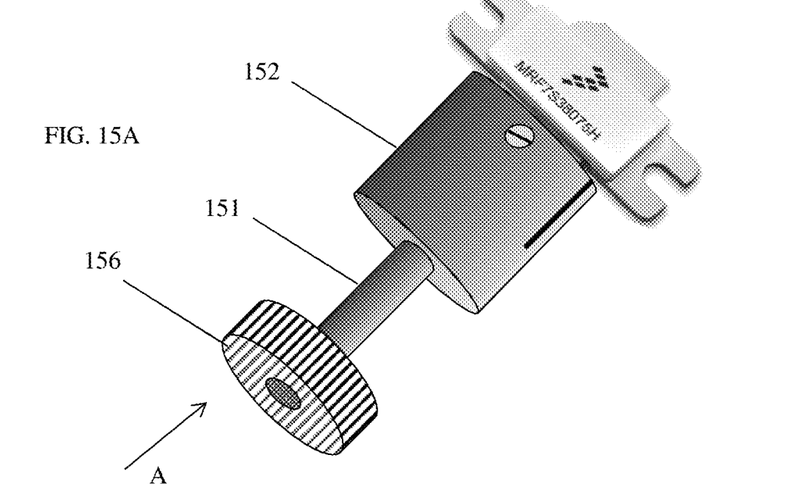
FIG. 15A depicts a 3D view of transforming segment with elliptical cross section and mounted DUT.
Figure 15B:
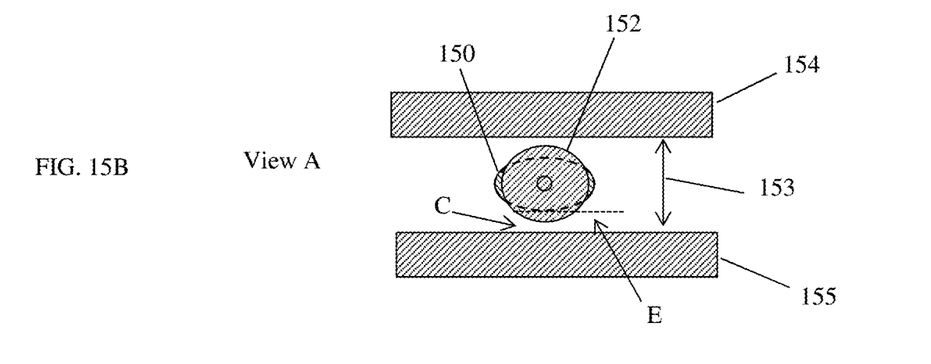
FIG. 15B depicts the associated component contours in a view from the fixture test port and connector.

Simple calculations show that the various characteristic impedances of the transforming sections (152), cascaded with the 50Ω sections (151) and the connectors (156), can be generated by a combination of width versus height of the cross section of the airlines (in the case of a cylinder width=height=diameter). If the impedance requirement is such as to dictate a maximum diameter (150) fitting into the fixture walls (154, 155) of the slabline height (153 and 66, FIG. 6), associated with an optimum width matching the package leads (50, 51, FIG. 5), then an elliptical cross section (152) offers a suitable compromise; as an example: in a 20 mm large cavity (153, 66) the cylindrical airline required to generate a 24.3 Ω characteristic impedance must have a diameter (150) of 17 mm, leaving only 1.5 mm gap "C" (Cylindrical) on each side towards the bottom (154) and cover (155) of the slabline; a parallelepiped cross section structure (not shown in FIG. 15) with a width of 17 mm, which is equal to the diameter of the cylindrical structure, needs only be 13 mm thick for the same result, leaving 3.5 mm space at the top and bottom. The elliptical solution using flattened cylinders or "ellipsoid" bodies (152) (best seen in cross section in FIG. 15B) lies in-between, allowing a higher gap "E" (Elliptical) at the same or slightly larger width; it is obvious that it is preferable to keep dimensions and gaps as large as possible to allow for higher manufacturing tolerances.

Although the present invention has been explained hereinabove by way of a number of preferred embodiments, it should be pointed out that other combinations of the described components are possible and, as far as obvious to a person skilled in the art, they shall not limit the scope of the present invention.

What I claim as my invention is:

1. A coaxial pre-matched RF transistor (DUT) test fixture comprising an input section attached to an input port,
   an output section attached to an output port,
   a metallic block (INSERT), which is inserted between the sections and carries the DUT, and
   a metallic cover extending from the input port to the output port,
   wherein the input and the output sections are slabline segments, each comprising a bottom metallic block,
   an associated section of the metallic cover,
   a coaxial connector attached to the corresponding port, and
   a center conductor attached to the connector and reaching from the connector to the INSERT, and wherein the center conductors of the slabline segments comprise a 50Ω section and at least one non-50Ω section,
   whereby the 50Ω sections are attached to the connectors and the non-50Ω sections are inserted between the 50Ω sections and the DUT.

2. The test fixture of claim 1, wherein a length of the at least one non-50Ω section is one quarter wavelength long at an operation frequency.

3. The test fixture of claim 1, wherein at least one non-50Ω section comprises a number N≥1 of cascaded segments 1, 2, . . . N with characteristic impedances Z1, Z2, . . . ZN, wherein segment 1 is attached to the 50Ω section and segment N is attached to the DUT, and wherein 50Ω>Z1>Z2 . . . >ZN,
   and wherein a length of the segments is optimized for DUT impedance matching and frequency bandwidth.

4. The test fixture of claim 1, wherein the center conductor of at least one slabline segment has a contour form of a lateral ramp, the ramp having a narrow end and a wide end, wherein the narrow end approximately matches a cross section of and is attached to the center conductor of a 50Ω section, which said 50Ω section is attached to the coaxial connector,
   and wherein the wide end has a width approaching a width of and is attached to a DUT terminal lead,
   and wherein a contour form and a length of the ramp are optimized to cover a frequency bandwidth.

5. The test fixture of claim 1 or 3, wherein the non-50Ω section has a form of a parallelepiped block.

6. The test fixture of claim 1 or 3, wherein the non-50Ω section is a co-axial cylinder.

7. The test fixture of claim 1 wherein the non-50Ω segment is a co-axial ellipsoid.

8. The test fixture of claim 1, wherein at least one non-50Ω segment is exchangeable.

9. The test fixture of claim 1, wherein at least one non-50Ω segment is co-axial ellipsoidal ramp.

* * * * *